(12) United States Patent  
Yamane et al.

(10) Patent No.: US 7,244,141 B2  
(45) Date of Patent: Jul. 17, 2007

(54) ELECTRIC CONNECTOR BOX

(75) Inventors: Shigeki Yamane, Mie (JP); Shinji Kawakita, Mie (JP); Masao Shibata, Aichi (JP); Hidemasa Yoshida, Aichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/320,581

(22) Filed: Dec. 30, 2005

(65) Prior Publication Data  
US 2006/0154518 A1 Jul. 13, 2006

(30) Foreign Application Priority Data  
Jan. 7, 2005 (JP) ............................ P2005-002733

(51) Int. Cl.  
*H01R 13/00* (2006.01)

(52) U.S. Cl. .................... 439/485; 439/487; 439/76.1; 361/719; 361/720; 361/752

(58) Field of Classification Search ............... 439/76.1, 439/76.2, 485, 487; 361/719, 720, 752  
See application file for complete search history.

(56) References Cited

U.S. PATENT DOCUMENTS 4,409,641 A * 10/1983 Jakob et al. ................. 361/720  
5,243,131 A * 9/1993 Jakob et al. ................. 174/536  
6,881,077 B2 * 4/2005 Throum ...................... 439/76.1

FOREIGN PATENT DOCUMENTS

JP A 2004-40873 2/2004

* cited by examiner

*Primary Examiner*—Tho D. Ta  
(74) *Attorney, Agent, or Firm*—Oliff & Berridge, PLC

(57) ABSTRACT

In a heat radiator plate, a mounting bracket extending from a peripheral edge portion of the heat radiator plate, an auxiliary heat radiator plate portion extending along the mounting bracket and positioned between the mounting bracket 39 and a body through a gap and a radiant heat radiator portion formed on a top end of the auxiliary heat radiator plate portion and opposing to the body through the gap are provided. Heat generated by a circuit construction body is conducted from the heat radiator plate, the auxiliary heat radiator plate portion and the radiant heat radiator portion to the gap and radiated to the body through the gap. The heat radiation characteristics of the connector box are improved.

7 Claims, 7 Drawing Sheets

ELECTRIC CONNECTOR BOX

CROSS-REFERENCE TO RELATED APPLICATIONS

This application is based on and claims the benefit of priority from the prior Japanese Patent Application No. 2005-2733, filed on Jan. 7, 2005; the entire contents of which are incorporated herein by reference.

BACKGROUND OF THE INVENTION

1. Field of the Invention

The present invention relates to an electric connector box having a casing in which a circuit substrate is housed.

2. Description of Related Arts

For example, JP-A-2004-40873 discloses an electric connector box for distributing power from a vehicle-mounted power source to various electric and electronic parts. The described electric connector box takes in the form of a casing having a frame, in one opening of which a heat radiator plate is mounted and in the other opening of which a cover is mounted. A circuit substrate is housed within the casing. A mounting bracket for mounting the electric connector box on a vehicle is formed on the heat radiator plate and the electric connector box is mounted to a body of the vehicle by screwing a bolt into a bolt hole formed in the mounting bracket.

Since large current flows from the power source through the circuit substrate, an amount of heat generated in the circuit substrate becomes relatively large correspondingly to the current. When temperature in the electric connector box due to heat generated by the circuit substrate becomes high, the electric and electronic parts mounted on the circuit substrate may operate erroneously or may be deformed. Therefore, it is preferable to rapidly radiate heat generated by the circuit substrate externally from the connector box. In the prior art electric connector box, heat generated from the circuit substrate is radiated by mounting a heat radiator plate on the circuit substrate through an insulator material and making the heat radiator plate in contact with the body.

SUMMARY OF THE INVENTION

Nowadays, the improvement of safety and comfortableness of automobile has been requested. In order to realize such improvement, the number of electric and electronic parts to be mounted on a vehicle is increased. Thus, an amount of current flowing through the circuit substrate of the electric connector box is increased and an amount of heat generated by the circuit substrate tends to be increased correspondingly. Therefore, the improvement of heat radiation of the electric connector box is also required. In order to improve the heat radiation of the electric connector box, it may be considered to make the size of the heat radiator plate large. The electric connector box is usually mounted in a limited space of a vehicle such as an engine room thereof. Therefore, such increased size of the radiator plate may interfere with other parts such as a battery and an engine, which are arranged within the engine room. In this point of view, it is necessary to take some measures for efficiently utilizing an inside space of the electric connector box.

The present invention has been made in view of the above circumstances and provides an electric connection box capable of improving heat radiation by efficiently utilizing an inside space thereof.

According to an aspect of the invention, an electric connector box includes a casing, a mounting bracket, and an auxiliary heat radiator plate portion. The casing includes a frame and a heat radiator plate mounted on a mounting body. The casing houses a circuit substrate. The mounting bracket mounts the electric connector box on the mounting body. The mounting bracket extends stepwise from a peripheral edge portion of the heat radiator plate. The mounting bracket has a bearing surface on a top end portion. The bearing surface is closely fixed to the mounting body by a tightening member. The auxiliary heat radiator plate portion extends from the peripheral edge portion of the heat radiator plate. The auxiliary heat radiator plate portion is spaced apart from the mounting body.

According to another aspect of the invention, the auxiliary heat radiator plate portion extends along the mounting bracket in a vicinity of the mounting bracket.

According to another aspect of the invention, the auxiliary heat radiator plate portion is integrally formed with and connected to the mounting bracket.

According to another aspect of the invention, a top of the auxiliary heat radiator plate has a radiant heat radiator portion that is opposed to the mounting body through a substantially uniform gap.

According to another aspect of the invention, the circuit substrate is a circuit constructing body. The circuit constructing body includes a printed wiring board having one surface on which a switching element is mounted and the other surface to which a plurality of bus bars connected to the switching element are adhered. The heat radiator plate is adhered to the other surface of the printed wiring board to which the plurality of bus bars are adhered.

BRIEF DESCRIPTION OF THE DRAWINGS

These and other objects and advantages of this invention will become more fully apparent from the following detailed description taken with the accompanying drawings in which.

DESCRIPTION OF THE EMBODIMENTS

Figure 1:
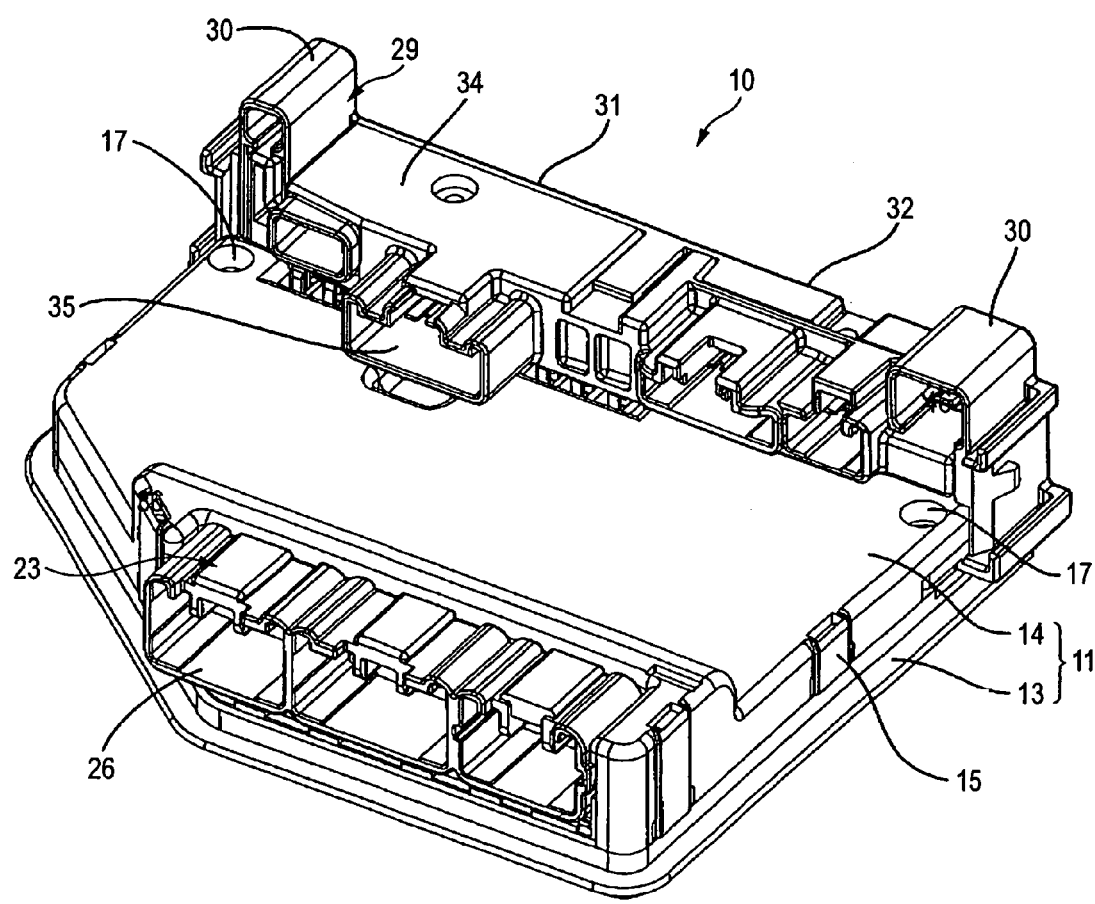
FIG. 1 is a perspective view of an electric connector box according to an embodiment.
Figure 2:
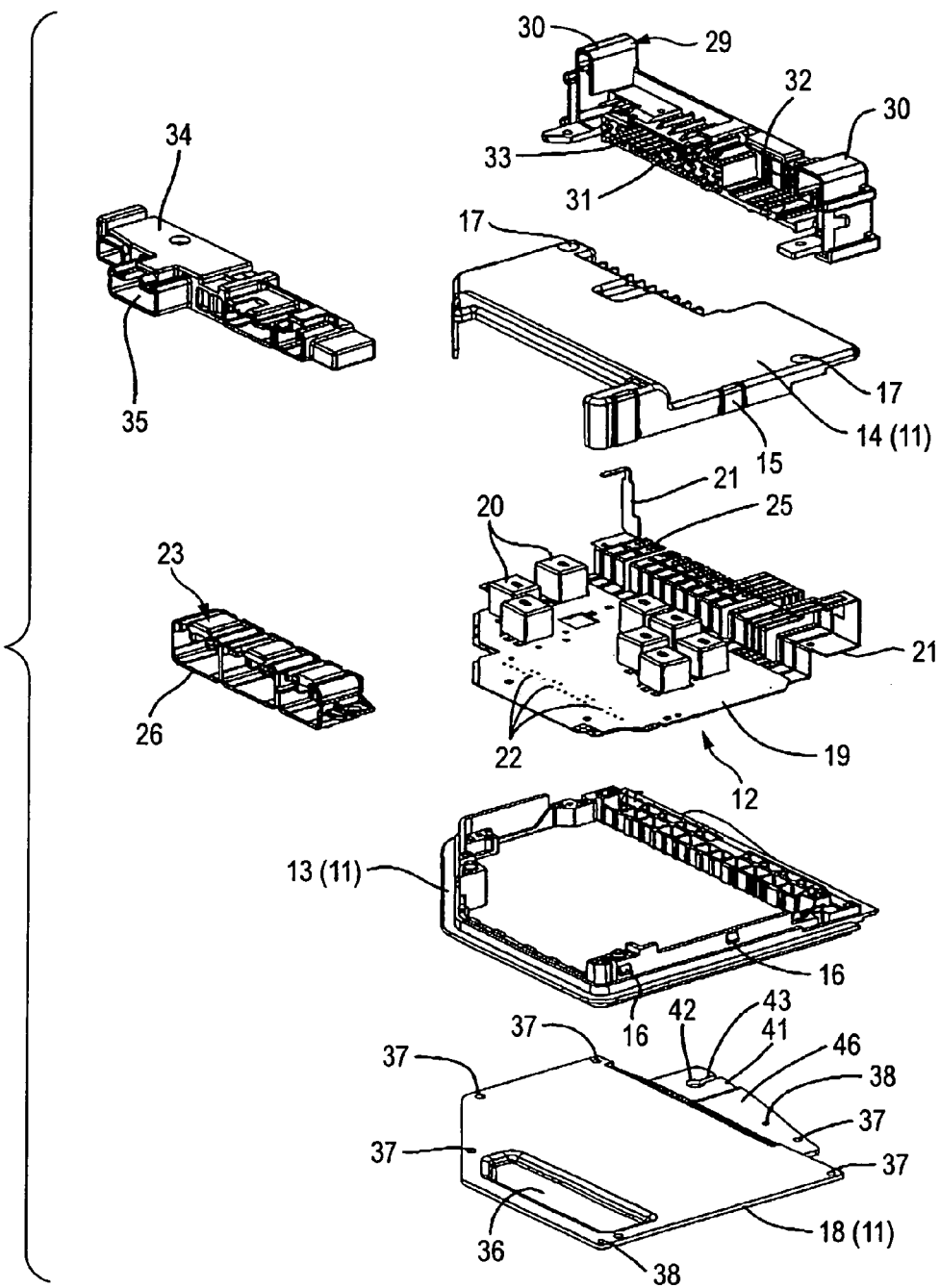
FIG. 2 is a disassembled perspective view of the electric connector box.
Figure 3:
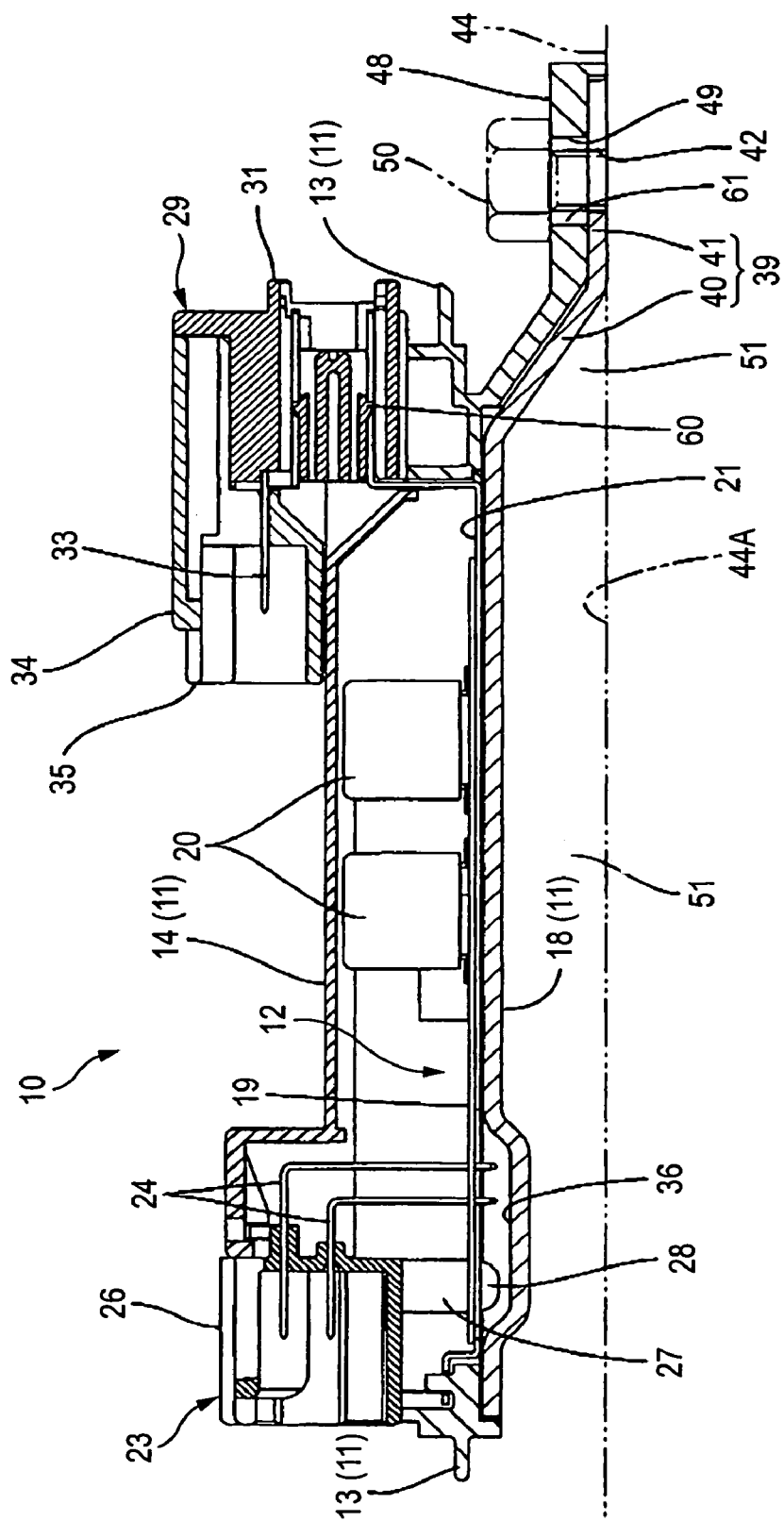
FIG. 3 is a cross sectional view of the electric connector box.

An embodiment will be described with reference to FIGS. 1 to 7. As shown in FIGS. 1 to 3, an electric connection box 10 according to the embodiment is mounted on a vehicle. The electric connector box 10 is configured by a flat casing 11 and a circuit construction body 12 (a circuit substrate) is arranged in the flat casing 11.

As shown in FIG. 2, the flat casing 11 includes a frame body 13 having an upper and a lower side opened, a cover 14 covering the upper opening and a heat radiator plate 18 mounted on the lower opening of the frame body 13. The frame body 13 takes in a form of a rectangular frame, one of four corners of which is cut away, and surrounds the circuit construction body 12 completely. A locking protrusion 16 for locking a lock piece 15 to be described later is provided on an outside surface of a side wall of the frame body 13. On the other hand, the lock piece 15, which is flexible, is provided on the side wall of the cover 14 in a position corresponding to the locking protrusion 16. A pair of cover mounting holes 17 is formed in an upper wall of the cover 14 in positions near right side end portions thereof as shown in FIG. 2. The cover 14 and the frame body 13 are jointed together by an elastic locking of the locking piece 15 and the locking protrusion 16 and by screws, which are not shown and are inserted into the frame body 13 through the cover mounting holes 17. Positioning pins (not shown) are provided on the lower surface of the frame body 13 to position the heat radiator plate 18 with respect to the frame.

As shown in FIG. 3, the circuit construction body 12 is arranged an inside of the frame body 13. The circuit construction body 12 includes a printed wiring board 19 having substantially the same configuration as the inside of the frame body 13, a control circuit formed on an upper surface of the printed wiring plate 19, switching elements 20 are mounted on the upper surface of the printed wiring plate 19, and a plurality of bus bars 21 mounted on a lower surface of the printed wiring board 19 and electrically connected to terminals of the switching elements 20. Incidentally, the bus bars 21 are integrally attached to the printed wiring board 19 through a thin insulating adhesion sheet (not shown). As shown in FIG. 2, through-holes 22 are formed on a left front side of the circuit constriction body 12, into which terminals 24 of PCB connectors 23 to be described later, are inserted.

The bus bars 21 are formed by punching a metal plate to form predetermined current paths constituting a power circuit. The bus bars 21 protrude in parallel from a right end side of the circuit construction body 12 as shown FIG. 2. Except the leftmost one of the bus bars shown in FIG. 2, the bus bars 21, which are arranged in an intermediary, are bent at a right angle twice above the upper surface of the circuit construction body 12, so that top ends of the bent bus bars protrude toward a right end side of the circuit construction body 12 as shown in FIG. 2. A slit 25 is formed in each of the top ends of the bus bars, and fuses, which are not shown, are inserted into the respective slits 25. The another bus bar 21 is further bent at a right angle twice, so that a top end thereof protrudes on a left front side as shown in FIG. 2.

The PCB connector 23 is mounted on a left side end portion of the circuit construction body 12 shown in FIG. 3. A lateral side length of the PCB connector 23 is longer. The PCB connector 23 has connector housings 26 of a synthetic resin material. Left sides of the PCB connector 23 are opened as shown in FIG. 3. One end of the terminals 24, which have L-shapes and are arranged side-by-side, protrudes into the opened portion of the connector housings 26 and the other end thereof protrude downward through end walls of the connector housings 26. The downward protruding terminals 24 are inserted through the through-holes 22 formed in the circuit construction body 12 and soldered to the control circuit. A cylindrical fixing portion 27 protrudes downward from the lower surface of the connector housing 26 and the connector housing 26 and the circuit construction body 12 are fixed-together by a screw 28 screwed to the fixing portion 27 through the lower surface side of the circuit construction body 12.

In FIG. 3, a fuse block 29 is mounted on the right end portion of the circuit construction body 12. The fuse box 29 is formed of a synthetic resin material and has a rectangular form with long sideways. As shown in FIG. 1, connector portions 30 are provided in opposite longer side end portions of the fuse block 29, respectively. The connector portions 30 are opened on a left front side as shown in FIG. 1 and, between the connector portions 30, a fuse mounting portion 31 is provided on one side and a terminal housing portion 32 is provided on the other side.

A plurality of mounting holes (not shown) are opened on right sides of the fuse mounting portion 31 shown in FIG. 3 to mount fuses, which are not shown. On a lower side of each mounting hole, the bus bar 21 protruded rightward in FIG. 3 is mounted and held by a lock 60. One end of a connecting tab 33 coupled with the bus bar 21 is mounted on an upper side of the mounting hole and the other end of the connecting tab 33 protrudes to the left front side shown in FIG. 2. The connecting tab 33 is in a shape of a tab and forms a pair with the bus bar 21. On the other hand, in the connector portion 30 and the terminal housing portion 32, the bus bars 21 protruding to the left front side in FIG. 2 are housed.

A relay connector 34 is connected to leftward from a region between the fuse mounting portion 31 and the terminal housing portion 32 in the fuse block 29 in FIG. 2. In the relay connector 34, the connecting tabs 33 and the bus bars 21 protruding from the fuse mounting portion 31 and the terminal housing portion 32 in left-front direction in FIG. 2 are fitted into a fitting portion 35 of the relay connector 34, which is opened on a left front side in FIG. 2.

The heat radiator plate 18 is mounted below the circuit construction body 12 and the frame body 13. The heat radiator plate 18 functions to radiate heat generated in such as the switching elements 20. The heat radiator plate 18 has substantially the same shape as a contour of the frame body 13 and is formed from a metal plate of such as aluminum having high heat transfer rate. In order to avoid interference with the end portions of the terminals 24 inserted into the PCB connector 23, which protrudes from the lower surface of the circuit construction body 12 and interference between the screws 28, which fix the connector housing 26 to the circuit construction body 12, and the heat radiator plate 18, a relief recess portion 36 is formed in a left end portion of the heat radiator plate 18 in FIG. 3. As shown in FIG. 2, heat radiator plate mounting holes 37 for inserting screws such as tapping screws and positioning holes 38 for inserting positioning pins (not shown) of the frame body 13 are formed in a peripheral portion of the heat radiator plate 18. The peripheral portion of the heat radiator plate 18 is adhered to the lower surface of the frame body 13 with the positioning pins (not shown) being inserted into the positioning holes 38 and the frame body 13 and the heat radiator plate 18 are fixed together by screwing the positioning pins. On the other hand, the bus bars 21 of the circuit construction body 12 are adhered to the upper surface of the heat radiator plate 18 by insulating adhesive.

A space defined by the heat radiator plate 18 and the frame body 13 standing from an outer periphery of the heat radiator plate 18 is filled with potting agent (not shown) for waterproof purpose. A waterproof structure of the circuit construction body 12 is made sure by coating the surface of the circuit construction body 12 with the potting agent.

Figure 4:
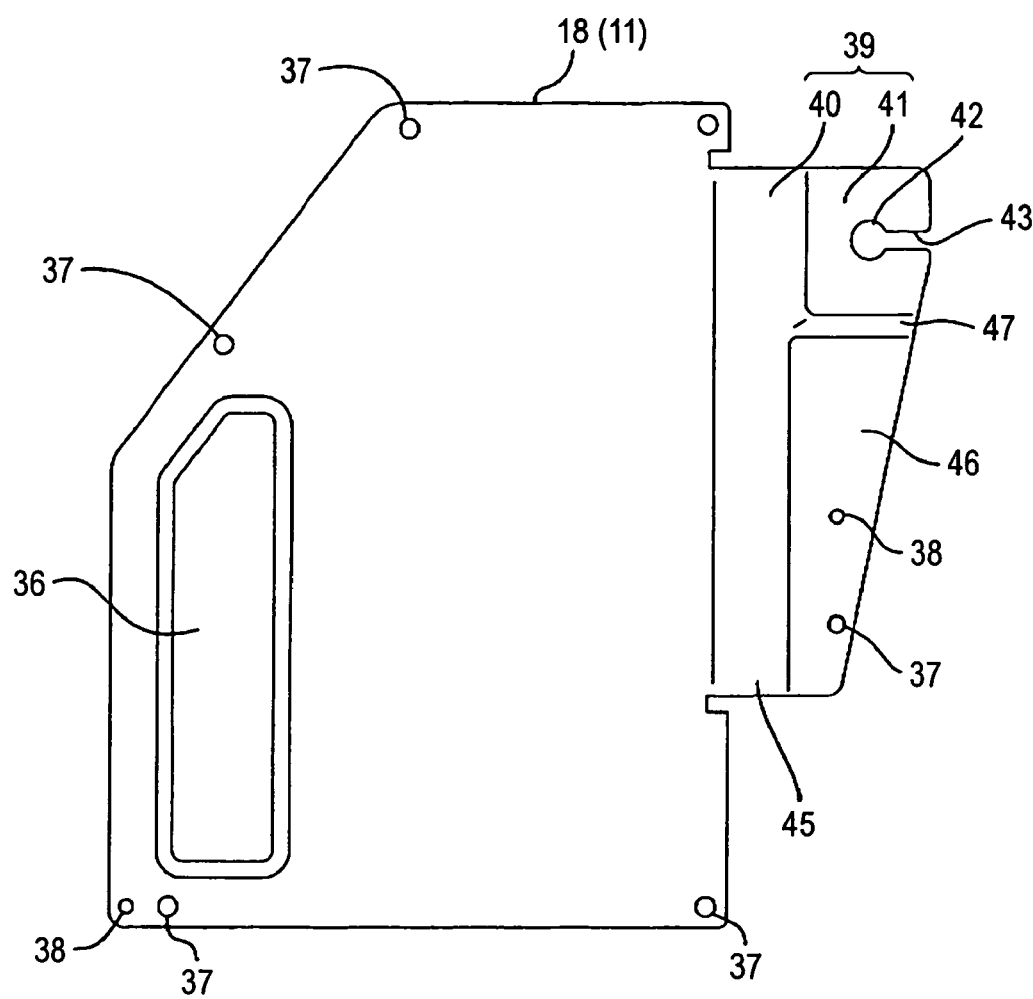
FIG. 4 is a plan view of a heat radiator plate.

A mounting bracket 39 in a plate shape is formed in an area of the heat radiator plate 18, which extends from a vicinity of an upper end of a right edge of the heat radiator plate 18 to the right side thereof (opposite side of the frame body 13) in FIG. 4. The mounting bracket 39 is formed by bending the area stepwise as shown in FIG. 4. In detail, the mounting bracket 39 is connected to a right side edge of the heat radiator plate 18 in FIG. 5 and includes a slanted portion 40 extending downward right with respect to the right side edge of the heat radiator plate 18 and a mounting surface 41 extending rightward from the right side edge of the slanted portion 40 in substantially parallel to the heat radiator plate 18. A substantially circular bolt hole 42 is formed in the mounting surface 41 and a slit 43 extending from the right side edge of the mounting surface 41 to the bolt hole 42 is also formed. A bolt 50 (a tightening member) is inserted into the bolt hole 42 and the electric connector box 10 is mounted on the vehicle by screwing the bolt into a female screw (not shown) formed in a body 44 (a mounting body) of the vehicle.

An auxiliary heat radiator plate portion 45 is formed in an area of the heat radiator plate 18, which generally extends rightward (the extending direction of the mounting bracket 39) from the right side edge which is a inner position with respect to the mounting bracket 39 the right side edge, as shown in FIG. 4. Describing this in more detail, the auxiliary heat radiator plate portion 45 is connected to the right edge of the heat radiator plate 18 in FIG. 5 and extends downward in a slanted direction (along the slanted portion 40) with respect to the right side of the heat radiator plate 18. A width of the auxiliary heat radiator plate portion 45 (in a vertical direction in FIG. 4) is set smaller than the width of the heat radiator plate 18 to set it to a shape of a mounting surface 44A to be described later, so that the auxiliary heat radiator plate portion 45 becomes a narrow rectangular shape as a whole. A size of the auxiliary heat radiator plate portion 45 measured from the right edge of the heat radiator plate 18 in the extending direction is slightly smaller than that of the slanted portion 40. An upper edge of the auxiliary heat radiator plate portion 45 in FIG. 4 is joined with the slanted portion 40 as shown in FIG. 6. With the auxiliary heat radiator plate portion 45 and the slanted portion 40, which are joined together, it is possible to reinforce the mounting bracket 39 by the auxiliary heat radiator plate portion 45. Further, since the rigidity of the auxiliary heat radiator plate portion 45 is also improved by the mounting bracket 39, it is possible to prevent the auxiliary heat radiator plate 45 from being vibrated due to vibration of the vehicle.

Figure 5:
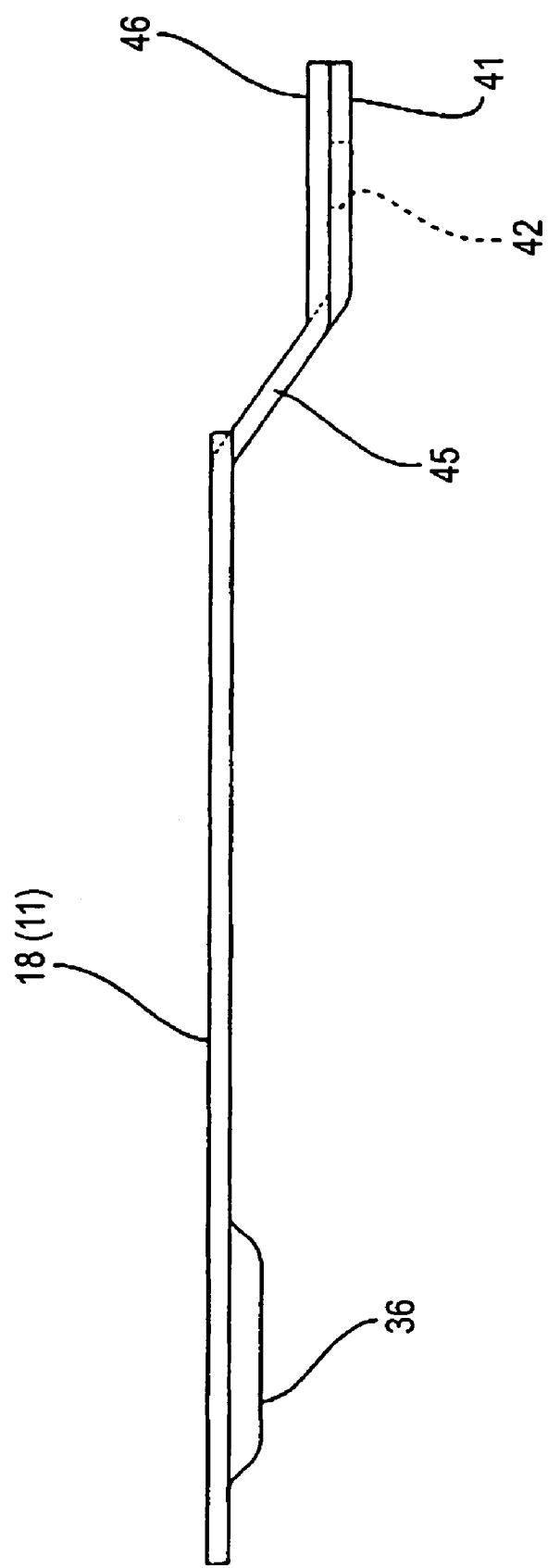
FIG. 5 is a side view of the heat radiator plate.
Figure 6:
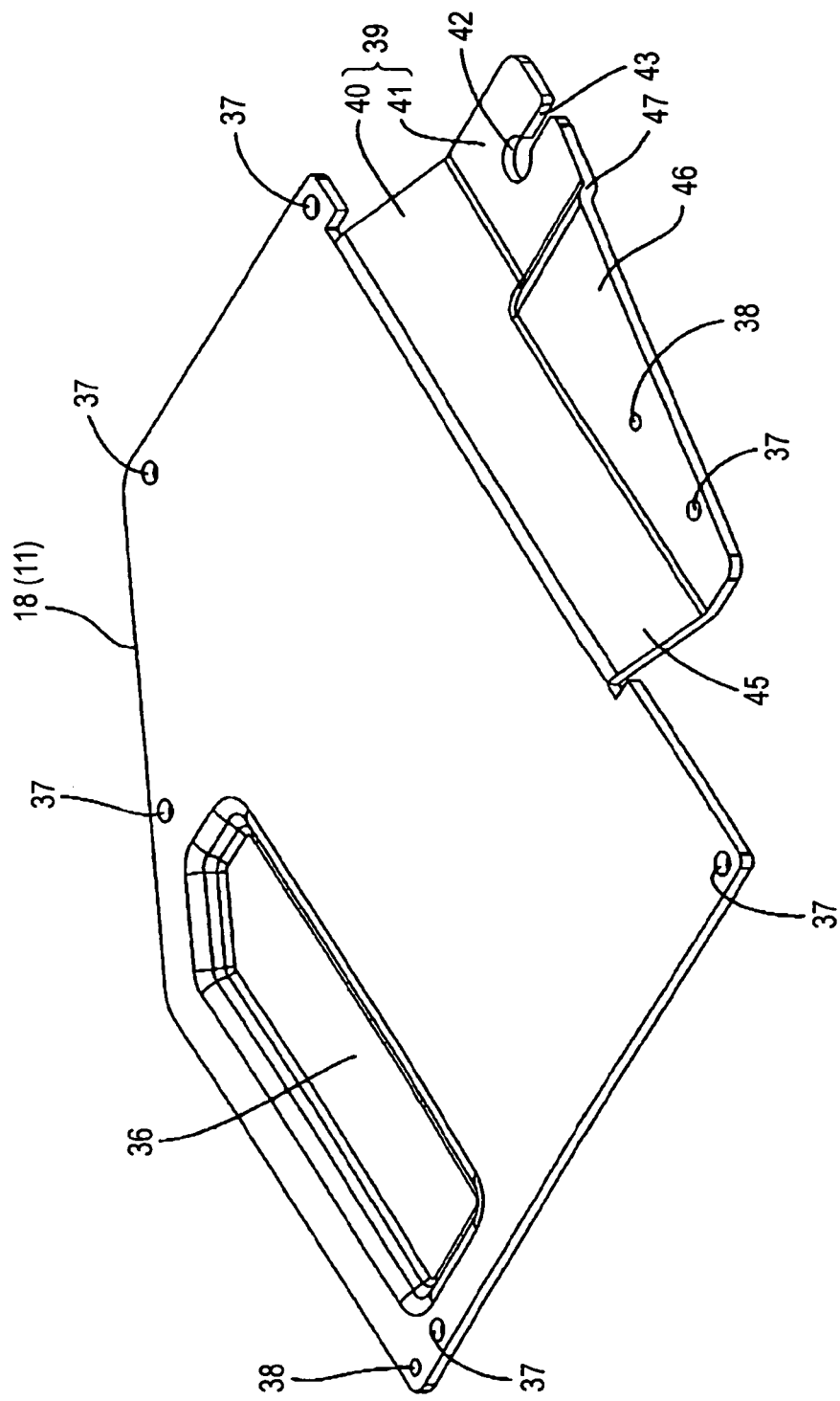
FIG. 6 is a perspective view of the heat radiator plate.

In FIG. 5, a right side edge of the auxiliary heat radiator plate portion 45 is extended to form a radiant heat radiator portion 46 extending substantially in parallel to the heat radiator plate 18. Size of the radiant heat radiator portion 46 in a width direction (vertical direction in FIG. 4) is substantially equal to the width of the auxiliary heat radiator plate portion 45 to form a narrow rectangular-shape as a whole. The right edge of the radiant heat radiator portion 46 in FIG. 4 is slanted with respect to the right edges of the slanted portion 40, the auxiliary heat radiator portion 45 and the heat radiator plate 18 and the size of the radiant heat radiator portion 46 in a horizontal direction in FIG. 4 is gradually increased from the lower edge thereof toward the upper edge thereof.

The upper edge of the radiant heat radiator portion 46 in FIG. 4 is firmly connected to the mounting surface 41. Since, therefore, the radiant heat radiator portion 46 is reinforced by the mounting surface 41, it is possible to prevent the radiant heat radiator portion 46 from being vibrated due to vibration of the vehicle. Further, the mounting surface 41 shown in FIG. 5 is positioned below the radiant heat radiator portion 46 as shown in FIG. 6 and a step 47 is formed between the mounting surface 41 and the radiant heat radiator portion 46 by hammering.

Incidentally, upper surfaces of the mounting bracket 39, the auxiliary heat radiator plate portion 45 and the radiant heat radiator portion 46 are substantially covered intimately by a bracket cover 48 formed in a substantially plate shape and in the frame body 13 (FIG. 3). Since, therefore, the peripheral portions of the radiator plate 18, the mounting bracket 39, the auxiliary heat radiator plate portion 45 and the radiant heat radiator portion 46 are covered by the frame body 13, it is possible to prevent a worker from being injured when he touches the peripheral portions. A through-hole 49 is formed in the bracket cover 48 correspondingly in position to the bolt hole 42 and bolted to the body 44 through a collar 61 inserted into the through-hole 49 and the radiator plate 18.

The connector box 10 is mounted on the body 44 of the vehicle, with the mounting bracket 39 thereof being upward.

Now, the working and the advantages of this embodiment will be described.

The connector box 10 is mounted on the flat mounting surface 44A of the body 44 in the vertical direction, which is provided in an area other than an uneven area and an area provided for working. In mounting the electric connector box 10 on the body 44, the mounting bracket 39 formed on the heat radiator plate 18 thereof is positioned upward as mentioned above with a back surface of the heat radiator plate 18 being opposed to the mounting surface 44A of the body 44. Then, the bolt 50 is inserted from the front surface of the heat radiator plate 18 into the through-hole 49 and the bolt hole 42 and screwed into a female screw (not shown) formed in the mounting surface 44A. In this case, since the electric connector box 10 is fixed to the body 44 through the collar 61 inserted in the bracket cover 48 and the heat radiator plate 18, it is possible to prevent the bracket cover 48 from being cracked to thereby fix the connector box 10 stably even when a large force is exerted on the screwing portion of the bolt 50 due to the bolting and vibration of the vehicle.

In a state where the electric connector box 10 is mounted on the body 44, a back surface of the mounting surface 41 of the mounting bracket 39 contacts closely to the mounting surface 44A. Further, due to the slanted portion 40 formed in the mounting bracket 39 and the step 47 formed between the mounting surface 41 and the radiant heat radiator portion 46, a predetermined space is provided between the mounting surface 44A and the heat radiator plate 18, the auxiliary heat radiator plate portion 45 and the radiant heat radiator portion 46. Heat radiated from the heat radiator plate 18, the auxiliary heat radiator plate portion 45 and the radiant heat radiator portion 46 is radiated into a gap 51 formed between the mounting surface 44A and the heat radiator plate 18, the auxiliary heat radiator plate portion 45 and the radiant heat radiator portion 46.

Figure 7:
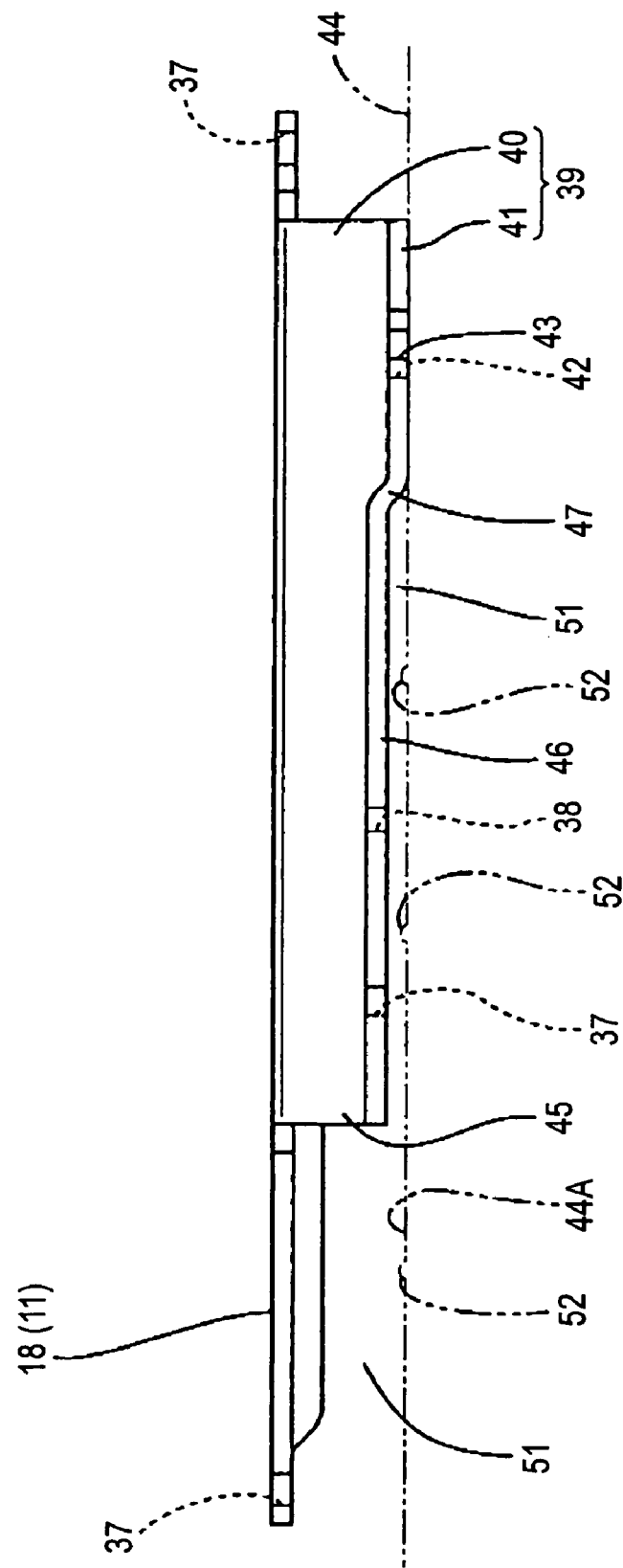
FIG. 7 is a back side view of the heat radiator plate.

Since the body 44 of the vehicle is formed by welding parts, which are prepared by pressing, together, there is fine unevenness of the surface of the body 44, which is formed by pressing and/or welding of the parts. By making the radiant heat radiator portion 46 in a relief from the body 44, a contact area between them can be made smaller than a case where the radiant heat radiator portion 46 is face-connected to the body 44 in the same plane as the mounting surface 41. Therefore, probability of the radiant heat radiator portion 41 getting on protruded portions 52 on the body 44, which are formed by the pressing and/or the welding, is lowered, so that the electric connector box can be fixed to the body more closely. (FIG. 7).

The switching elements 20 mounted on the circuit construction body 12 generate heat by currents flowing through them. Heat generated by the switching elements 20 is conducted to the bus bars 21 through the terminals and then to the heat radiator plate 18 adhered to the bus bars 21. The bus bars 21 generate heat by currents flowing through them. Heat generated by the bus bars is also conducted to the heat radiator plate 18 and is radiated from the heat radiator plate 18 to the gap 51. The heat radiator plate 18 as well as the slant portion 40 of the mounting bracket 39, the auxiliary heat radiator plate portion 40 and the radiant heat radiator portion 46 face the gap 51 and the heat transferred from the heat radiator plate 18 to the slanted portion 40, the auxiliary heat radiator plate portion 45 and the radiant heat radiator portion 46 is discharged. Further, heat is transferred from the heat radiator plate 18, the slanted portion 40, the auxiliary heat radiator plate portion 45 and the radiant heat radiator portion 46 to the body 44 through the gap 51 by radiation. Particularly, since the size of the gap 51 between the radiant heat radiator portion 46 and the mounting surface 44A is substantially uniform, it is possible to conduct heat efficiently by radiation. Further, heat conducted to the mounting surface 41 is conducted from the mounting surface 44A to the body 44 through the face-contact thereof.

According to this embodiment, heat can be radiated from the mounting bracket 39, the auxiliary heat radiator plate portion 45 and the radiant heat radiator portion 46, in addition to the heat radiator plate 18. Therefore, it is possible to improve the heat radiation of the electric connector box 10 to thereby prevent increase of temperature within the electric connector box 10.

Further, the auxiliary heat radiator plate portion 45 is positioned in the space between the heat radiator plate 18 and the body 44. Therefore, the auxiliary heat radiator plate portion 45 can be formed by extending from the heat radiator plate 18 without interference with parts such as the engine and the battery, so that the space defined by the electric connector box 10 can be utilized efficiently.

Further, the gap 51 is formed between the radiant heat radiator portion 46 and the mounting surface 44A and distances between the mounting surface 44A and the heat radiator plate 18, the auxiliary heat radiator plate portion 45 and the radiant heat radiator portion 46 within the gap 51 are set such that the protruded portions 52 formed on the surface of the body 44 by pressing work and/or welding work do not interfere with the radiant heat radiator portion 46 (FIG. 7). Therefore, it is possible to fix the electric connector box 10 to the body 44 more closely.

According to the above-embodiment, heat conducted from the heat radiator plate to the auxiliary heat radiator plate portion is radiated to atmosphere and transferred to the mounting body by radiation. Since, therefore, heat generated from the circuit substrate is radiated by both of the heat radiator plate and the auxiliary heat radiator plate portion, the heat radiation of the electric connector box can be improved.

Further, the auxiliary heat radiator plate portion is arranged in a space between the heat radiator plate and the mounting body. Since, therefore, the auxiliary heat radiator plate portion can be provided by enlarging from a portion of the heat radiator plate without interference with parts such as the engine and the battery, the inside space of the electric connector box can be utilized efficiently.

According to the above-embodiment, the auxiliary heat radiator plate portion is extended along and in the vicinity of the mounting bracket and therefore, is positioned in a portion of the space between the electric connector box and the mounting body, which is in the vicinity of the mounting bracket. In the prior art connector box, the space in the vicinity of the mounting bracket is a dead space. According to the second aspect of the present invention, the auxiliary heat radiator plate portion can be formed by effectively utilizing the dead space.

According to the above-embodiment, the auxiliary heat radiator plate portion is integrally connected to the mounting bracket. Therefore, the mounting bracket can be reinforced by the auxiliary heat radiator plate portion. Further, since the rigidity of the auxiliary heat radiator plate portion is improved by the mounting bracket, it is possible to prevent the auxiliary heat radiator plate portion from being vibrated by vibration of the vehicle.

According to the above-embodiment, the space gap having uniform size is formed between the radiant heat radiator portion and the mounting body. Therefore, it is possible to efficiently radiate and transfer heat from the radiant heat radiator portion to the mounting body through the space gap to thereby improve the heat radiation of the electric connector body.

Since large current flows through switching elements, heat generated by the switching elements is relatively large. Therefore, it is preferable to efficiently discharge heat generated by the switching elements externally of the electric connector box.

According to the above-embodiment, heat generated by the switching elements is conducted to bus bars connected to the switching elements and then efficiently radiated from the heat radiator plate adhered to the bus bars externally of the electric connector box. Therefore, it is possible to prevent temperature in the connection box from being increased.

OTHER EMBODIMENTS (1) Although, in the described embodiment, the mounting bracket 39 and the auxiliary heat radiator plate portion 45 are formed integrally, the mounting bracket 39 and the auxiliary heat radiator plate portion 45 may be formed separately and the auxiliary heat radiator plate portion 45 may be formed in the vicinity of and along the mounting bracket 39.

(2) In the described embodiment, the radiant heat radiator portion 46 is formed in the top end of the auxiliary heat radiator plate portion 45. However, when increase of temperature within the electric connector box 10 can be restricted by only the heat radiator plate 18 and the auxiliary heat radiator plate portion 45, the radiant heat radiator portion 46 may be removed.

(3) In the described embodiment, the auxiliary heat radiator plate portion 45 is connected to the mounting bracket 39. However, the auxiliary heat radiator plate portion 45 may be formed by extending from a peripheral edge of the heat radiator plate 18 other than the peripheral edge from which the mounting bracket 39 is formed, or may be provided separately from the mounting bracket 39.

(4) In the described embodiment, the switching elements 20 are relays. However, the switching elements 20 may be semiconductor relays.

(5) In the described embodiment, the mounting bracket 39, the auxiliary heat radiator plate portion 45 and the radiant heat radiator portion 46 are formed integrally. However, the mounting bracket 39, the auxiliary heat radiator plate portion 45 or the radiant heat radiator portion 46 may be provided separately from the heat radiator plate 18. In such case, a material of the mounting bracket 39, the auxiliary heat radiator plate portion 45 or the radiant heat radiator portion 46 may be the same as or different from the material of the heat radiator plate 18.

(6) In the described embodiment, the mounting bracket 39, the auxiliary heat radiator plate portion 45 and the radiant heat radiator portion 46 are covered by the bracket cover 48. However, an opening portion may be provided in the bracket cover 48 to expose the mounting bracket 39, the auxiliary heat radiator plate portion 45 or the radiant heat radiator portion 46. In such case, since heat can be radiated from the mounting bracket 39, the auxiliary heat radiator plate portion 45 or the radiant heat radiator portion 46 exposed through the opening portion, the heat discharge of the connector box 10 is further improved.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined solely by the following claims and their equivalents.

What is claimed is:

1. An electric connector box comprising:
    a casing including a frame and a heat radiator plate mounted on a mounting body, the heat radiator plate facing a surface of a circuit substrate that opposes a component surface having a component mounted thereon;
    a mounting bracket mounting the electric connector box on the mounting body, the mounting bracket extending stepwise from a peripheral edge portion of the heat radiator plate, the mounting bracket having a bearing surface on a top end portion, the bearing surface being closely fixed to the mounting body by a tightening member; and
    an auxiliary heat radiator plate portion extending from the peripheral edge portion of the heat radiator plate and separated from the mounting body by a first gap, and the auxiliary heat radiator plate portion being spaced apart from the mounting body.

2. An electric connection box according to claim 1, wherein the auxiliary heat radiator plate portion extends along a portion of the mounting bracket in a vicinity of the mounting bracket.

3. An electric connection box according to claim 1, wherein the auxiliary heat radiator plate portion is integrally formed with and connected to the mounting bracket.

4. An electric connection box according to claim 1, wherein a top of the auxiliary heat radiator plate portion has a radiant heat radiator portion that is opposed to the mounting body through a substantially uniform gap.

5. An electric connection box according to claim 1, wherein the circuit substrate is a circuit constructing body,
    wherein the circuit constructing body includes a printed wiring board having the component surface on which a switching element is mounted and the surface that opposes the component surface to which a plurality of bus bars connected to the switching element are adhered, and
    wherein the heat radiator plate is adhered to the surface of the printed wiring board to which the plurality of bus bars are adhered.

6. An electric connection box according to claim 1 further comprising a heat radiating portion that extends from the bearing surface of the mounting bracket and the auxiliary heat radiator plate portion.

7. An electric connection box according to claim 6, wherein the heat radiating portion is integrally formed with the mounting bracket and is separated from the mounting body by a second gap.

* * * * *